US008565343B1

(12) United States Patent
Husted et al.

(10) Patent No.: US 8,565,343 B1
(45) Date of Patent: Oct. 22, 2013

(54) TRANSMIT POWER CONTROL UTILIZING LOOPBACK ERROR VECTOR MAGNITUDE THRESHOLDS

(75) Inventors: Paul J. Husted, San Jose, CA (US); Michael P. Mack, Sunnyvale, CA (US); Soner Ozgur, Santa Clara, CA (US); Yann Ly-Gagnon, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 216 days.

(21) Appl. No.: 13/171,236

(22) Filed: Jun. 28, 2011

Related U.S. Application Data

(60) Provisional application No. 61/359,747, filed on Jun. 29, 2010.

(51) Int. Cl.
*H04L 25/49* (2006.01)
*H04B 1/04* (2006.01)

(52) U.S. Cl.
USPC .................................. 375/297; 455/114.3

(58) Field of Classification Search
USPC ............ 375/296, 295, 297, 259, 260; 455/91, 455/114.2, 114.3, 127.1, 127.2; 330/127, 330/129, 131
See application file for complete search history.

(56) References Cited

U.S. PATENT DOCUMENTS

| | | | |
|---|---|---|---|
| 5,049,832 A | 9/1991 | Cavers | |
| 7,139,534 B2 | 11/2006 | Tanabe et al. | |
| 7,184,721 B2 | 2/2007 | Asirvatham et al. | |
| 7,274,748 B1 | 9/2007 | Khlat | |
| 7,346,317 B2 | 3/2008 | Rahman et al. | |
| 7,348,844 B2 | 3/2008 | Jaenecke | |
| 7,542,518 B2 | 6/2009 | Kim et al. | |
| 7,551,686 B1 | 6/2009 | Coons et al. | |
| 7,653,147 B2 | 1/2010 | Palaskas et al. | |
| 7,653,410 B2 | 1/2010 | Itsuki | |
| 7,724,840 B2 | 5/2010 | McCallister et al. | |
| 7,848,717 B2 | 12/2010 | Liu | |
| 7,894,844 B2 | 2/2011 | Hiddink et al. | |
| 7,899,416 B2 | 3/2011 | McCallister et al. | |
| 7,940,120 B2 | 5/2011 | Grebennikov et al. | |
| 7,940,198 B1 | 5/2011 | Velazquez | |
| 8,023,588 B1 | 9/2011 | Benson et al. | |
| 8,064,851 B2 | 11/2011 | McCallister | |
| 8,150,335 B2 | 4/2012 | Waheed et al. | |
| 8,270,530 B2 * | 9/2012 | Hamada et al. | 375/296 |

(Continued)

*Primary Examiner* — Sam K Ahn
*Assistant Examiner* — Vineeta Panwalkar
(74) *Attorney, Agent, or Firm* — Bay Area Technology Law Group PC

(57) ABSTRACT

A device and method for adjusting transmit power in a wireless communication device. The wireless communication device comprises a transmitter having a power amplifier, wherein the amplifier may introduce distortion into the transmit signal. The method may periodically determine an error vector magnitude (EVM) level in the transmitter of the wireless communication device. The EVM level may be determined based on differences between an ideal transmit signal without amplification, and an actual transmit signal with amplification. The method may then adjust one or more transmit gain settings of at least one gain stage of the wireless device based on the measured EVM level in the transmitter. In one embodiment, as the EVM increases, indicating that more distortion is being introduced, the method may reduce the gain settings of the gain stage(s) to reduce this distortion. If the EVM decreases, the method may increase the gain of the gain stage(s).

28 Claims, 12 Drawing Sheets

(56) References Cited

U.S. PATENT DOCUMENTS

| | | | |
|---|---|---|---|
| 2001/0050592 A1* | 12/2001 | Wright et al. | 330/2 |
| 2003/0117215 A1* | 6/2003 | O'Flaherty et al. | 330/149 |
| 2004/0155707 A1* | 8/2004 | Kim et al. | 330/149 |
| 2004/0219884 A1* | 11/2004 | Mo et al. | 455/67.11 |
| 2005/0143027 A1 | 6/2005 | Hiddink et al. | |
| 2007/0069813 A1* | 3/2007 | Li et al. | 330/149 |
| 2007/0223365 A1* | 9/2007 | Tsfaty et al. | 370/208 |
| 2009/0061919 A1 | 3/2009 | Rofougaran | |
| 2010/0035554 A1 | 2/2010 | Ba et al. | |
| 2010/0197365 A1 | 8/2010 | Ripley et al. | |

* cited by examiner

TRANSMIT POWER CONTROL UTILIZING LOOPBACK ERROR VECTOR MAGNITUDE THRESHOLDS

PRIORITY CLAIM AND INCORPORATION BY REFERENCE

This application claims benefit of priority to U.S. provisional application Ser. No. 61/359,747, titled "Transmit Power Control Utilizing Loopback Error Vector Magnitude Thresholds", filed Jun. 29, 2010, whose inventors are Paul J. Husted, Michael P. Mack, and Soner Ozgur, which is hereby incorporated by reference in its entirety as though fully and completely set forth herein.

U.S. patent application Ser. No. 12/580,709, entitled "Power Amplifier Linearization Using Digital Predistortion" by Peiris et al., filed Oct. 16, 2009, is hereby incorporated by reference in its entirety as if set forth herein.

BACKGROUND OF THE INVENTION

1. Field of the Disclosure

The present invention relates generally to transmission devices, and more particularly to transmit power control in transmission devices.

2. Description of the Related Art

Transmission devices often utilize control algorithms to control the transmission power, i.e., the power used in transmitting signals. In general, the term "transmit power control" refers to the intelligent selection of transmit power in a communication system to achieve good (or desired) performance within the system. The notion of "good performance" can depend on the system context and may include optimizing metrics such as signal to noise ratio, link data rate, network capacity, geographic coverage and range, and power consumption, among others. Transmit power control algorithms are used in many areas, including wireless LANs, cellular networks, etc.

A transmit power control algorithm will often increase the transmit power of the transmitter in some situations to provide a higher signal power at the receiver. The higher signal-to-noise ratio (SNR) at the receiver results in better reception at the receiver, i.e., results in a reduced bit error rate on the digital communication link. An increased transmit power can also be used to achieve a higher data rate of transmission across the communication link. For example, a higher SNR may allow a system that uses link adaptation to transmit at a higher data rate, thus achieving greater spectral efficiency. Another potential benefit is that an increased transmit power for a given modulation typically yields an increased signal range. In a cellular network, a higher transmit power results in a lower probability of dropped calls. In a wireless system having a fading channel, a higher transmit power provides greater protection against signal fade.

However, using a higher transmit power has various drawbacks. For example, a higher transmit power increases the overall power consumption of the device. This is of particular concern in mobile devices, where battery life is very important. Also, a higher transmit power increases the interference to other users in the same frequency band, which is undesirable.

Power control algorithms are often designed to accommodate the performance criteria of the designer. Power control is generally a difficult problem, as power control algorithms must strike a balance between the benefits of increased SNR and the drawbacks of increased power consumption and signal interference.

It is often a challenge to design a transmit power control (TPC) algorithm to achieve absolute accuracy. This is because output power can be affected by variations in process, temperature, frequency, voltage, soldering, and board component tolerances, among others.

Closed loop power control schemes attempt to use feedback loops and power detectors to achieve a desired accuracy. However, when used, the power detectors themselves typically have to be calibrated. Further, some manufacturers are including wireless communication chips direct on board (DoB), which in some designs makes calibration with an external power meter undesirable or impossible.

Another method to achieve power control accuracy is to perform open loop power control with calibration to reduce chip (process) variation. However, such calibration is challenging to get correct, and does not correct for board to board variation.

Therefore, improvements in power control algorithms are desired.

SUMMARY OF THE INVENTION

Embodiments of the invention relate to a method for adjusting transmit power in a wireless communication device. The wireless communication device may include a transmitter having a power amplifier, which may introduce distortion into the transmit signal. The wireless communication device may be configured to perform the method. The method may be performed as follows.

An error vector magnitude (EVM) level may periodically be determined in the transmitter of the wireless communication device. The EVM level may be determined based on differences between an ideal transmit signal without amplification, and an actual transmit signal with amplification. One or more transmit gain settings of the power amplifier may be adjusted based on the measured EVM level in the transmitter. In one embodiment, as the EVM increases, indicating that more distortion is being introduced by the power amplifier, the gain settings of the amplifier may be reduced to reduce this distortion. If the EVM decreases, the gain of the amplifier may be increased.

Estimation of the EVM level in the transmitter of the wireless communication device may include receiving the ideal transmit signal, which may not have been amplified by the power amplifier. An analog version of the actual transmit signal (e.g., the signal which is output from the power amplifier) may also be received. In other words, the actual transmit signal may have passed through the transmit stage of the device. The actual transmit signal may be put through part of a receive chain, e.g., may be processed as a received signal; for example, down-mixing and analog to digital conversion may be performed on the transmit output of the power amplifier, producing a digital version of the actual transmit signal. The two waveforms (i.e., the ideal transmit signal waveforms and the actual transmit signal waveforms) may then be aligned (e.g., in magnitude and phase), and compared. Any differences between the waveforms of the ideal and actual transmit signals may be determined (e.g., based on comparing the waveforms). At least some of the differences may be due to transmit path nonlinearity. The EVM may then be estimated based on the determined differences.

In some embodiments, estimating the EVM may be performed in the time domain. As one example, embodiments are considered in which a difference vector between the ideal transmit signal waveforms and the actual transmit signal waveforms. The root mean square of the difference vector may be calculated. The root mean square of the ideal transmit waveforms may also be calculated. The root mean square of the difference vector may be divided by the root mean square of the ideal transmit waveforms. The result of dividing the RMS of the difference vector by the RMS of the ideal transmit waveforms may be used as the EVM estimate. Other ways of estimating the EVM (including frequency domain EVM estimations) are also considered.

In some embodiments, adjustments to the transmit gain settings of the power amplifier may also be based on one or more other factors. As a first example, embodiments are considered in which adjusting the one or more transmit gain settings of the power amplifier may also be based on a mathematical series based model of transmit effects on the actual transmit signal. For example, the model may be used to predict the effect of various gain adjustments of the power amplifier on the EVM of the actual transmit signal.

The model may be a volterra series based model, a polynomial series based model, or may be based on another type of mathematical series. The mathematical series based model may be determined based on differences between the ideal transmit signal and the actual transmit signal at a plurality of gain levels of the power amplifier.

As another example, adjustments to the transmit gain settings of the power amplifier may also be based on a piecewise linear model of transmit path effects on the actual transmit signal. For example, embodiments are considered in which differences between the ideal transmitted waveforms and the actual transmitted waveforms relative to signal size are analyzed. Information may be stored regarding a percentage of points that differ between the ideal transmitted waveforms and the actual transmitted waveforms at each gain level for a given transmission and output power target, based on this analysis. A resulting piecewise linear model may then be used to predict the effect of various gain adjustments of the power amplifier on the EVM of the actual transmit signal.

In some embodiments, a probability distribution function (PDF) of a typically transmitted signal may further be estimated. This may be used to estimate an expected value of a transfer function of the power amplifier. Possible transfer functions may include an expected squared error and/or a variance of the EVM estimate, among other possible transfer functions.

Another example of a factor on which adjustments to the transmit gain settings of the power amplifier may also be based is the power spectrum density of the actual transmit signal. It may be common, especially at high EVM levels, for spectral mask requirements to be more limiting to gain adjustments than EVM considerations. Thus, in some embodiments, a power spectrum density of the actual transmit signal may be determined. Determining the power spectrum density may include (e.g., be based on) rotation of the frequency of the actual transmit signal to each of a plurality of frequency offsets. It may be determined whether the power spectrum density of the actual transmit signal complies with a spectral mask of the transmit signal (e.g., of the wireless protocol or standard of the transmit signal). If the power spectrum density does not comply with the spectral mask, adjusting the transmit gain settings of the power amplifier may also be based on the determined power spectrum density of the actual transmit signal and the determination that the power spectrum density of the actual transmit signal does not comply with the spectral mask.

The transmitter may include power amplifier pre-distortion logic. In some embodiments, the power amplifier pre-distortion logic may perform this analysis of differences between the ideal transmitted waveforms and the actual transmitted waveforms relative to signal size. The power amplifier pre-distortion logic may also or alternatively perform other steps in the method, such as the alignment and comparison of ideal and actual transmit signal waveforms.

Embodiments are also contemplated in which estimating the EVM may include adding effects of phase noise to the EVM estimate.

Further embodiments of the invention relate to a device, such as a transmitter configured for use in a wireless communication device, which is configured to implement the method. The device may be configured to implement the method according to any of the various embodiments described herein. Such a device may include transmit logic configured to transmit a signal. The device may also include a power amplifier, power amplifier pre-distortion logic, and/or any of various other transmit logic components.

BRIEF DESCRIPTION OF THE DRAWINGS

A better understanding of the present invention can be obtained when the following Detailed Description of the Embodiments is read in conjunction with the following drawings, in which.

Figure 1A:
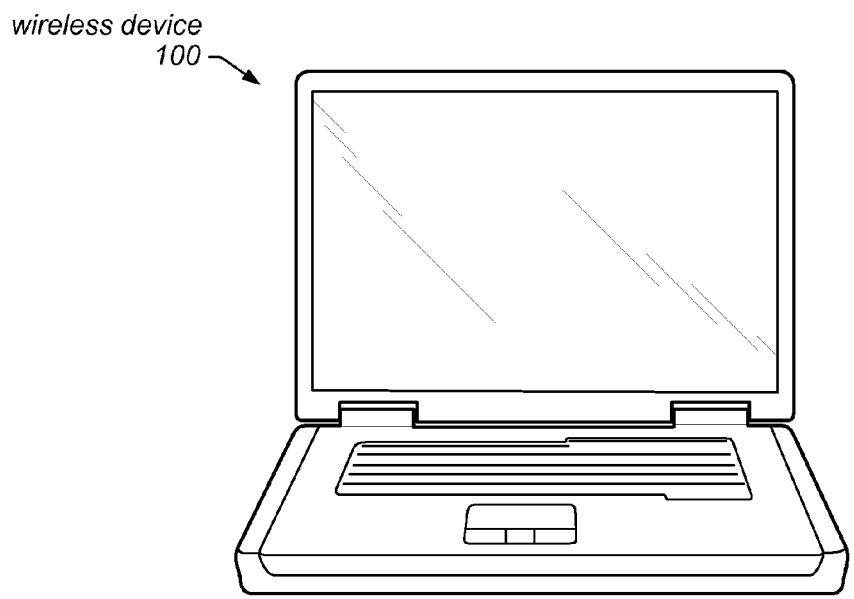
FIGS. 1A and 1B illustrates exemplary wireless devices, according to one embodiment.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS OF THE INVENTION

Figure 1B:
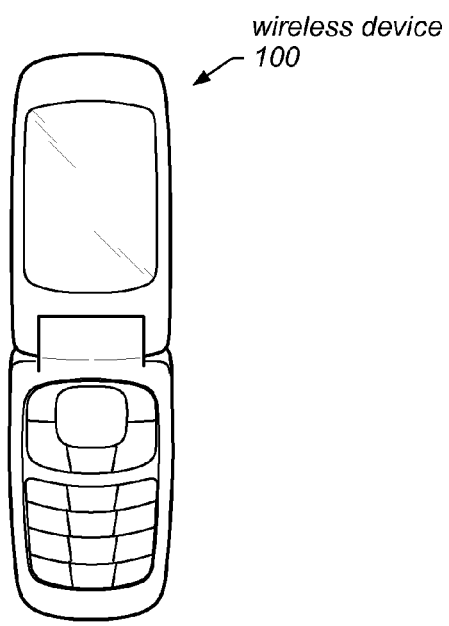

FIGS. 1A and 1B—Exemplary Wireless Devices

FIGS. 1A and 1B illustrate an exemplary wireless device 100, according to one embodiment. As shown in FIG. 1A, the wireless device 100 may be a portable computer or other mobile computing device. Alternatively, as shown in FIG. 1B, the wireless device 100 may be a cell phone or smart phone or other similar mobile device (which may also be classified as a mobile computing device). However, it should be noted that other wireless devices are envisioned, such as personal digital assistants, multimedia players (portable or stationary), routers, and/or other mobile devices/computing systems which are operable to use wireless communication.

The wireless device 100 may be configured to perform wireless transmission using a transmit power control algorithm as described herein. The transmit power control method may operate to measure Error Vector Magnitude (EVM) and use these EVM measurements in adjusting the transmit power gain. EVM is a metric used to measure the performance of a wireless (e.g., RF) device. EVM involves measuring a difference between modulated signals that would be provided by an ideal transmitter, without power amplifier distortion, and modulated signals transmitted by an actual transceiver, with power amplifier distortion. The EVM measurement may also be considered as measuring the difference between signals received by an ideal receiver (e.g., without power amplifier distortion) and the modulated signals that would be received by the actual receiver (with power amplifier distortion). The EVM is typically determined by measuring the difference of ideal locations (corresponding to the ideal transmitted signal) and actual locations (corresponding to the actual transmitted signal) of constellation points in a constellation diagram. More information regarding Error Vector Magnitude (EVM) is provided below with respect to FIGS. 12A and 12B.

Figure 2:
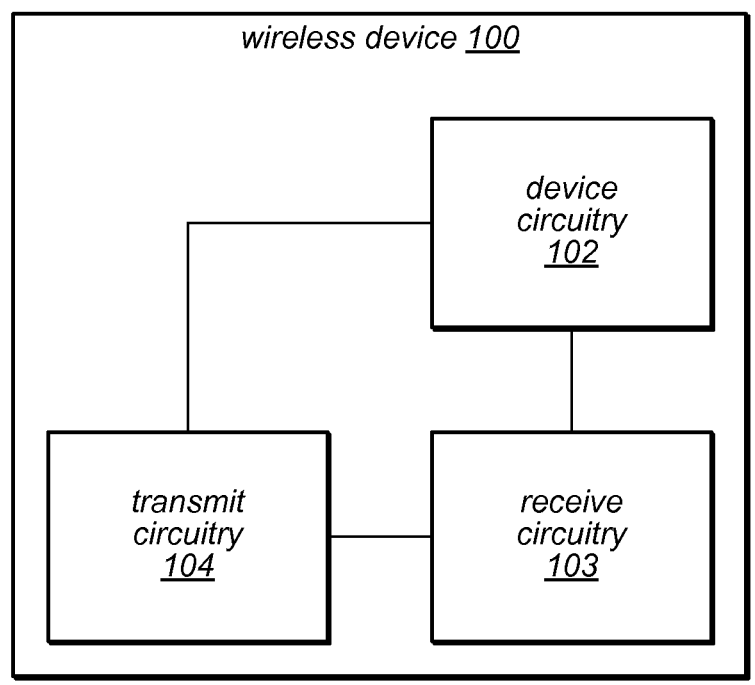
FIG. 2 is an exemplary block diagram of the wireless devices of FIGS. 1A and 1B, according to one embodiment.

FIG. 2 is a block diagram of the wireless device of FIG. 1. As shown, the wireless device 100 may comprise device circuitry 102, receive circuitry 103 and transmit circuitry 104.

Figure 3:
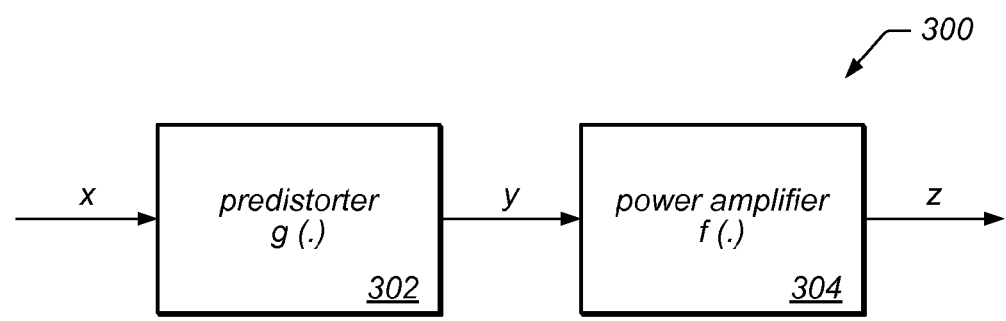
FIG. 3 is a block diagram that depicts an amplifier system in accordance with one or more embodiments.

FIG. 3 is a block diagram that illustrates an amplifier system 300 in accordance with one or more embodiments of the present technique. In some embodiments, amplifier system 300 includes a transmitter or transceiver that employs a power amplifier (PA) for signal transmission. As depicted, in some embodiments, amplifier system 300 includes a predistorter 302 and an amplifier 304. Amplifier 304 may comprise a power amplifier (PA). Amplifier 304 may include system components in addition to a PA. For example, a PA of amplifier 304 may be preceded by linear stages such as baseband and PA driver circuitry. In some embodiments, a digital to analog converter (DAC) is employed between predistorter 302 and power amplifier 304. In such an embodiment, predistorter 302 may be employed to predistort the signal to be transmitted prior to the digital-to-analog conversion to compensate for potential non-linearity in the PA output. For example, in the illustrated embodiment, predistorter 302 and power amplifier 304 are arranged in series such that an input signal 'x' is first fed through predistorter 302, generating a predistorted output signal 'y', which is then provided to power amplifier 304 as the amplifier input, where the amplifier yields the output signal 'z', as depicted. In some embodiments, output signal 'z' may include a signal with reduced or no distortion (e.g., a non-distorted signal).

To compensate for amplitude distortion, predistorter (e.g., predistorter 302) may be configured to pre-emphasize/amplify certain amplitude signals (e.g., higher amplitude signals) to ensure that the overall effective gain—of the predistorter stage and the amplifier stage as a whole—remains the same (e.g., having a linear relationship) regardless of the amplitude of the input. In some embodiments, predistorter 302 may be configured to introduce an offsetting (e.g., negative or opposite) phase shift with respect to the inherent phase shift of the amplifier, such that the effective phase shift—of the predistorter stage and the amplifier stage together—is zero. This may ensure that the overall phase shift is constant regardless of the amplitude. In some embodiments, predistorter 302 may be configured to compensate for memory effects (e.g., similar to those in a Volterra series) in power amplifier 304.

Figure 4:
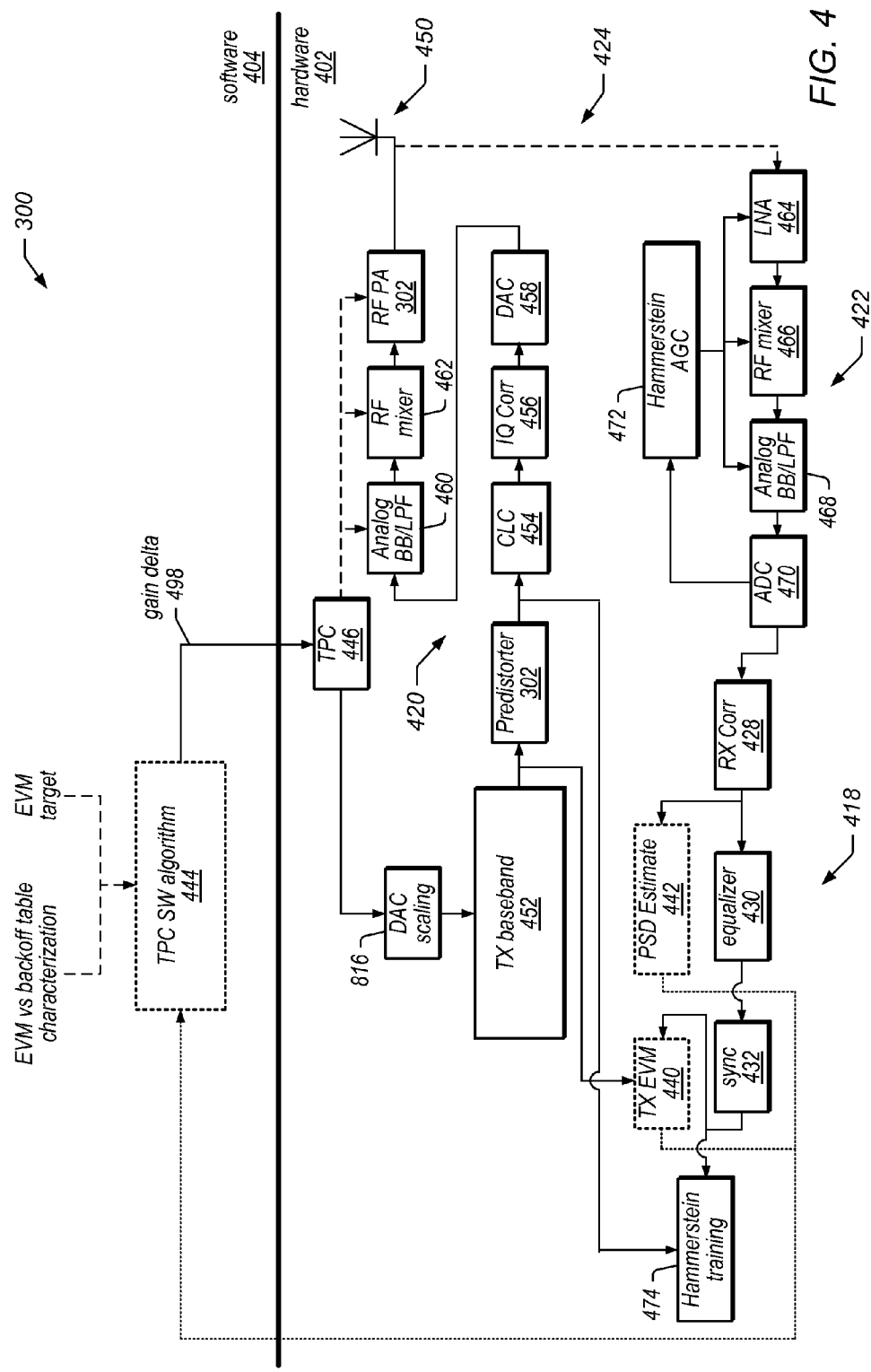
FIG. 4 is a block diagram of the amplifier system including the predistorter in accordance with one or more embodiments.

FIG. 4 is a block diagram illustrating a portion of the architecture of amplifier system 300 (which may be part of wireless device 100) in accordance with one or more embodiments of the present disclosure. For example, the amplifier system 300 illustrated in FIG. 4 may be configured to implement a method for adjusting transmit power in a wireless device using EVM measurements, such as illustrated and described with respect to FIGS. 10 and 11 according to various embodiments.

According to some embodiments, amplifier system 300 may include a hardware portion 402 and a software (or firmware) portion 404. The hardware portion 402 may include a transmitter path 420, a receiver path 422, and a loop-back path 424 coupling the transmitter path 420 to the receiver path 422. In addition, the hardware portion 402 may include a training portion 418, which may be configured to receive signals from the receiver path 422 and the transmitter path 420, and use them for one or more purposes. For example, the training portion 418 may be used to perform EVM measurements and/or perform spectral density estimations. The training portion 418 may be configured to send the EVM measurements and/or spectral density estimations to the software portion 404. Software portion 404 may include a transmit power control (TPC) software algorithm 444, which may in turn provide input to the TPC block 446 in hardware portion 402. The TPC block 446 may be configured to adjust one or more gain settings in transmitter path 420 based on the input from the TPC software algorithm 444. In summary, the amplifier system 300 may be configured to use a loop-back path to perform EVM measurements, which may be used in adjusting transmit power control settings. More detailed description of the illustrated embodiment is provided in the following paragraphs.

In the illustrated embodiment, transmitter path 420 may include transmit baseband logic 452, which may be configured to generate signals for transmission. A (typically smaller) portion of the signals may be passed to the TX EVM block 440 in training portion 418, which will subsequently be further described. Another (typically larger) portion of the signal may be passed to predistorter 302, which may, as noted with respect to FIG. 3, be configured to compensate for various non-linearities in amplifier system 300. The signals may be passed from the predistorter to the various components of the transmitter path 420 in turn, e.g., CLC 454, IQ Corr 456, digital to analog converter (DAC) 458, analog baseband/low pass filter 460, RF mixer 462, and RF power amplifier 304. In addition, the predistorter 302 may be configured to send a (typically smaller) portion of the signal to a predistorter training block (e.g., Hammerstein training block 474). From the RF power amplifier 304 the signals may be ready for transmission, e.g., via antenna 450. In other words, the signals from power amplifier 304 may be actual transmit signals, including any distortion introduced by the power amplifier 304 or any other portion of the transmitter path 420.

During training, a portion of the actual transmit signal may be provided via loop-back path 424 to receiver path 422. According to some embodiments, receiver path 422 may be part of the wireless device's 100 receive path for receiving wireless signals from other wireless devices. In other embodiments, receiver path 422 may be provided specifically for training, and may not be used in normal receive operations. In the illustrated embodiment, the receive path may include a low noise amplifier (LNA) 464, an RF mixer 466, an analog baseband/low pass filter 468, and an analog to digital converter (ADC) 470. Receiver path 422 may also include a Hammerstein automatic gain control (AGC) unit 472 in some embodiments.

From the receiver path 422, the actual transmit signals may be passed to the training portion 418. Training portion 418 may include an RX correlator 428, equalizer 430, sync 432, transmit (TX) error vector magnitude (EVM) block 440, PSD estimate 442, and Hammerstein training 474. TX EVM block 440 may be configured to receive the actual transmit signals (via the RX Corr 428, equalizer 430 and sync 432) as well as 'ideal' transmit signals, as previously noted, directly from the TX baseband 452. Equalizer 430 and sync 432 may be configured to align the actual transmit signals in phase and amplitude with the ideal transmit signals, such that a comparison may be performed between the ideal transmit signals and the actual transmit signals. An overview of EVM, including a description of various methods for computing EVM, is provided below in further detail. The TX EVM block 440 may pass the EVM measurements to TPC software algorithm 444 in software portion 404 of amplifier system 300.

Figure 5:
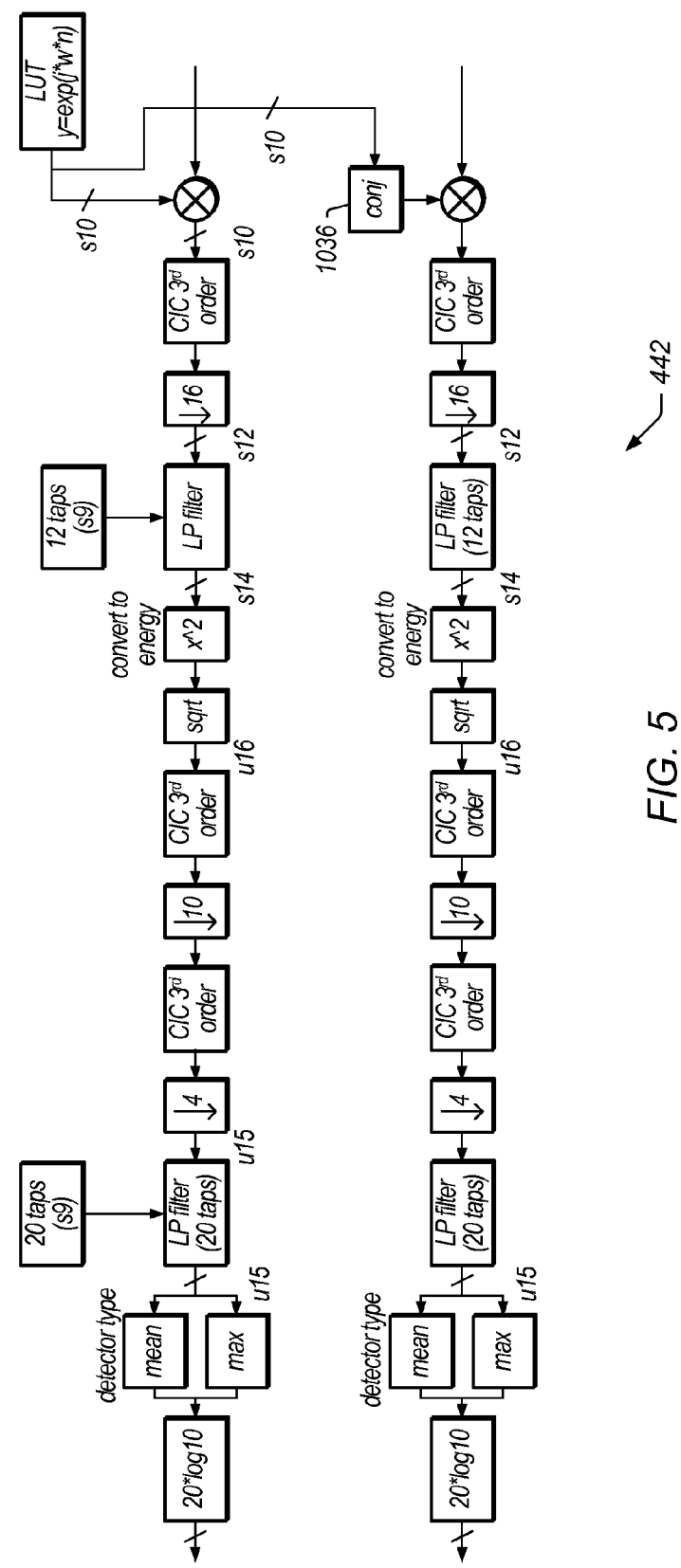
FIG. 5 is a block diagram of a correlator in accordance with one or more embodiments.

In addition to the TX EVM block 440, training portion 418 may in some embodiments also include a PSD estimate block 442. PSD estimate block 442, which may include one or more digital rotators, may be implemented in a variety of ways. FIG. 5 is provided as a block diagram illustrating one exemplary implementation of PSD estimate block 442, however, other implementations are also considered.

In some situations, and in particular in cases where the transmit signal exhibits a high EVM, transmit gain may be limited by spectral mask requirements (e.g., even more so than by EVM considerations). Accordingly, it may be helpful to provide spectral density estimations of the actual transmit signals to the transmit power control algorithm may in some situations. PSD estimate block 442 may be used to rotate the frequency of the transmit signals to one or more offset frequencies, e.g., in order to perform such a spectral density estimation. As one example, for a 20 MHz WLAN channel with Fs=80 Mhz, 100 kHz RBW and 30 kHz VBW, the PSD estimate block might include two digital rotators to measure power spectrum density at positive and negative frequency offsets. The rotators may be configured to run every 1 Mhz from −40 Mhz to 40 Mhz. In one embodiment, up to 8 (or more) different frequency offsets may be measured serially. Table 1 below shows the correlator offsets for various possible ADC rates for the PSD estimate block shown in FIG. 5, according to one embodiment.

Other correlator settings, including different numbers and/or intervals of frequency offsets, ADC rates, channel widths, RBW and/or VBW values, are also envisioned. Once measured, the power spectrum density may be passed from the PSD estimate block 442 to TPC software algorithm 444.

Thus, the output of the TX EVM 440 and PSD estimate 442 blocks may be provided to TPC SW algorithm 444 of the amplifier system 300. The TPC SW algorithm 444 may also receive (or calculate) other values relating to EVM based transmit power control. For example, as shown, the software may receive an EVM target value, which may be a maximum desired EVM for the device. The EVM target value may depend on the type of device; for example, different types of devices (e.g., using different components and architectures, and/or implementing different wireless technologies) may have different EVM target values.

As another example, TPC software algorithm 444 may be configured to determine, based on the power spectrum density, whether the transmit signal complies with the spectral mask requirements of the transmit signal (e.g., which may depend on the type of transmit signal, e.g., based on a protocol or standard of the transmit signal). As noted above, this may be important because in some situations, typically in which EVM is relatively high, spectral mask requirements may be more of a limiting factor with regard to power amplifier gain than EVM requirements.

Figure 6:
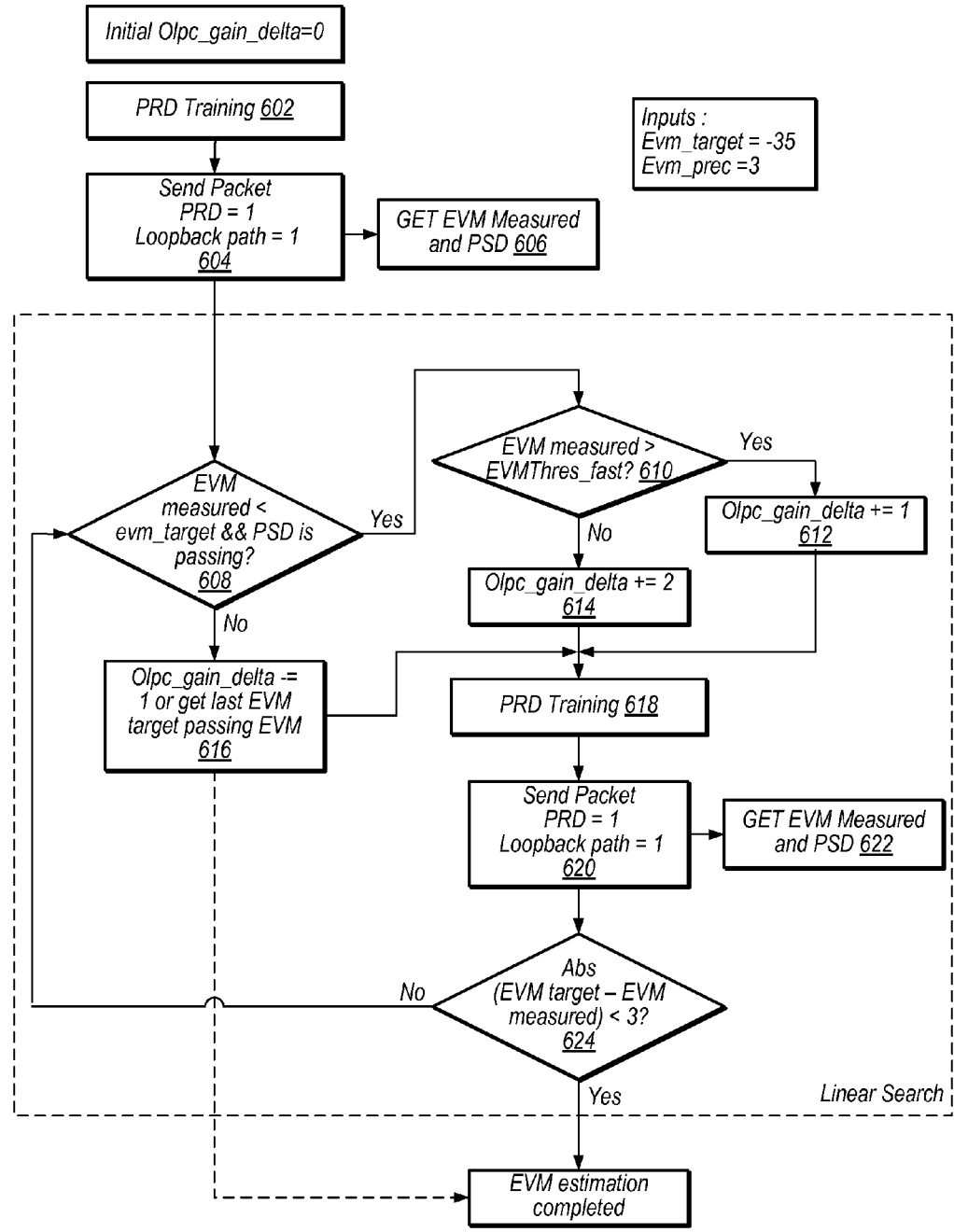
FIG. 6 is a flowchart diagram illustrating an algorithm for a TPC adjustment process according to one embodiment.
Figure 7:
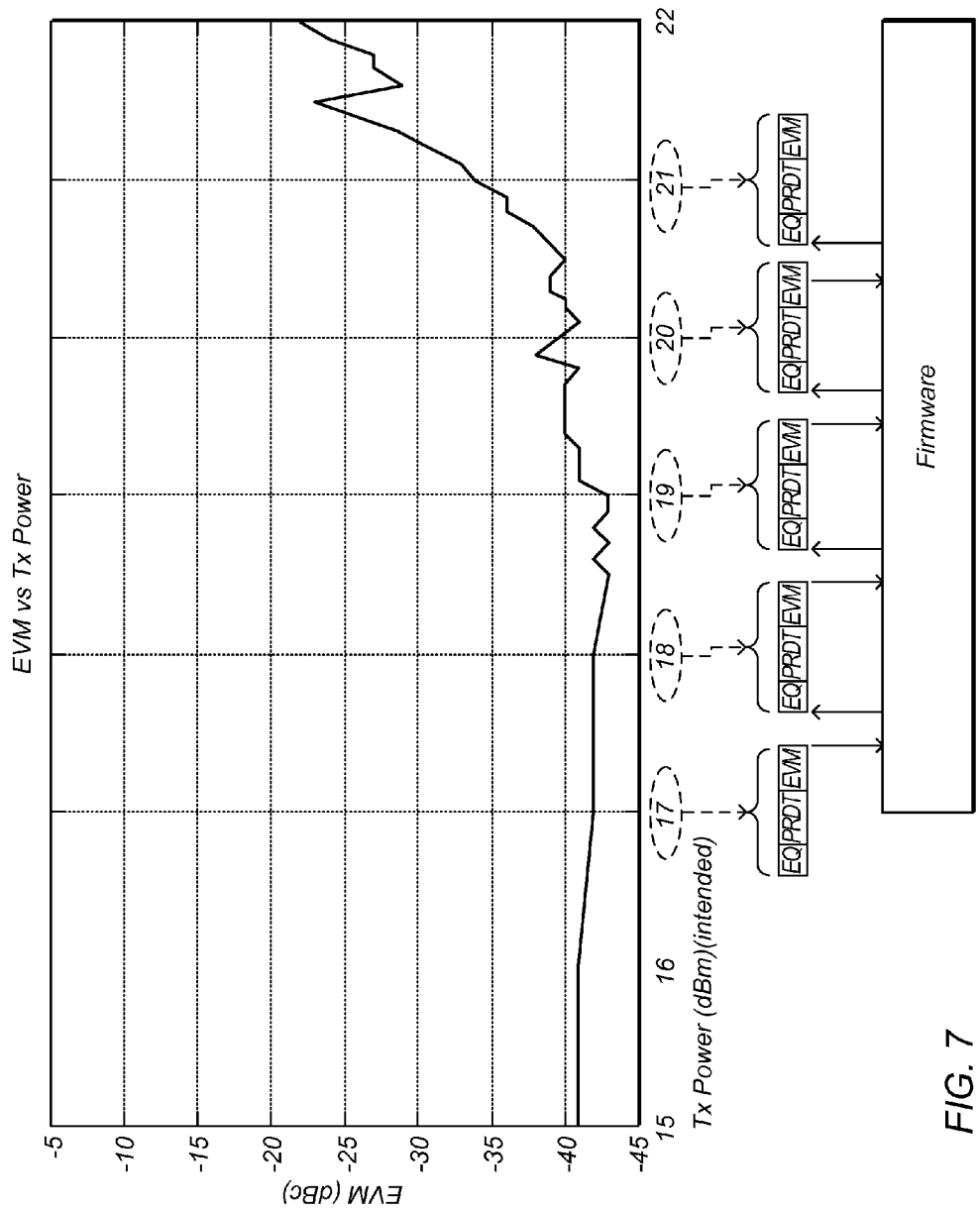
FIG. 7 is a graph illustrating part of an iterative linear search based transmit power control method in accordance with one or more embodiments.

The software may include an algorithm for determining, based on its inputs, a gain adjustment (e.g., a transmit power adjustment) value. For example, in one embodiment, a linear search (e.g., an iterative linear search) may be performed in order to adjust the TPC to a level which achieves the target EVM value. FIGS. 6 and 7 illustrate a possible methodology for one such linear search.

FIG. 6 is a flow diagram illustrating an algorithm for a TPC adjustment process in which the EVM target is −35 dBc with a desired precision of ±3 dBc. According to the exemplary embodiment, initial PreDistorter training may be performed at step 602. After the PreDistorter has been trained, data (e.g., a data packet) may be transmitted, with predistortion on, to the loopback path in step 604. The loopback path (e.g., TX EVM 440 and PSD estimate 442) may use this data to measure EVM and PSD and provide the results to the software performing the algorithm in step 606. In decision 608, it may be determined whether the measured EVM is less than the EVM target value and the PSD passes spectral mask requirements.

If the result of decision 608 is 'yes', it may be determined whether the measured EVM is greater than an intermediate EVM threshold (e.g., "EVMThes_fast") in step 610. If the

TABLE 1

| Correlator frequencies based on turbo mode | | | | | | | | | | |
|---|---|---|---|---|---|---|---|---|---|---|
| | ADCrate | | | | | | | | | |
| Rotator Settings | 80 Mhz | 88 Mhz 20 Mhz | | 160 Mhz | 176 Mhz HT40 | | 320 Mhz | | 352 Mhz VHT80 | |
| 20 | 20 Mhz | 22 | Mhz | 40 Mhz | 44 | Mhz | 80 Mhz | 88 | | Mhz |
| 21 | 21 Mhz | 23.1 | Mhz | 42 Mhz | 46.2 | Mhz | 84 Mhz | 92.4 | | Mhz |
| 22 | 22 Mhz | 24.2 | Mhz | 44 Mhz | 48.4 | Mhz | 88 Mhz | 96.8 | | Mhz |
| 23 | 23 Mhz | 25.3 | Mhz | 46 Mhz | 50.6 | Mhz | 92 Mhz | 101.2 | | Mhz |
| 24 | 24 Mhz | 26.4 | Mhz | 48 Mhz | 52.8 | Mhz | 96 Mhz | 105.6 | | Mhz |
| 25 | 25 Mhz | 27.5 | Mhz | 50 Mhz | 55 | | 100 Mhz | 110 | | Mhz |
| 26 | 26 Mhz | 28.6 | Mhz | 52 Mhz | 57.2 | Mhz | 104 Mhz | 114.4 | | Mhz |
| 27 | 27 Mhz | 29.7 | Mhz | 54 Mhz | 59.4 | Mhz | 108 Mhz | 118.8 | | Mhz |
| 28 | 28 Mhz | 30.8 | Mhz | 56 Mhz | 61.6 | Mhz | 112 Mhz | 123.2 | | Mhz |
| 29 | 29 Mhz | 31.9 | Mhz | 58 Mhz | 63.8 | Mhz | 116 Mhz | 127.6 | | Mhz | result of decision 610 is 'yes', a gain adjustment of +1 dBm may be performed in step 612. If the result of decision 610 is 'no', a gain adjustment of +2 dBm may be performed in step 614. Use of the intermediate EVM threshold may allow for faster gain adjustments in some embodiments. For example, if the EVM is sufficiently low that even if a larger gain adjustment (e.g., +2 instead of +1) is performed, it may still be expected that measured EVM will be less than the EVM target value and the PSD will pass spectral mask requirements, such a larger gain adjustment may be appropriate. However, use of such an intermediate EVM threshold may be optional and linear search algorithm embodiments are also envisioned in which no intermediate EVM threshold is used.

If the result of decision 608 is 'no', a gain adjustment of −1 dBm may be performed in step 616. In other words, if either the measured EVM is higher than the target EVM, or the PSD does not pass the spectral mask requirements, gain of the power amplifier may be adjusted downwards.

After any of steps 612, 614, or 616, the PreDistorter may be re-trained (e.g., because the transmit power has been adjusted) in step 618. After PreDistorter re-training, data (e.g., a data packet) may again be transmitted, with predistortion on, to the loopback path in step 620. The loopback path (e.g., TX EVM 440 and PSD estimate 442) may again use this data to measure EVM and PSD and provide the results to the software performing the algorithm in step 622. In decision 624, it may be determined whether the difference between the EVM target value and the measured EVM is less than 3 dBc. If the result of decision 624 is 'yes', the EVM based TPC adjustment may be completed. However, if the result of decision 624 is 'no', decision 608 may be performed, initiating another iteration of the algorithm.

It should be noted that in some embodiments, there may be an alternative response (shown as a dashed line) to a 'no' result from decision 608 in step 616. For example, if the PSD does not pass the spectral mask requirements but the measured EVM is less than the target EVM (e.g., by more than 3 dBc), this may indicate that transmit power is more limited by spectral mask considerations than EVM considerations, and continued iterations attempting to achieve the target EVM without violating the spectral mask may not be possible for the current target EVM. In this case, a previous (e.g., most recent or next-highest) gain value that passed spectral mask requirements may be determined and the TPC adjustment may be completed. As an alternative (not shown), in some embodiments the target EVM value or the EVM precision value may be adjusted to enable the possibility of both achieving the target EVM value and complying with the spectral mask requirements.

FIG. 7 is a graph illustrating an iterative linear search such as described above with respect to FIG. 6. In some embodiments EVM (e.g., in dBc) may have a non-monotonic relationship to intended transmit power (e.g., in dBm), such as that characterized by the curve shown in FIG. 7. If an initial transmit power is 17 dBm and the target EVM is 35 dBc, TPC SW algorithm 444 may perform a series of gain adjustments and re-measurements of EVM and PSD until the target EVM (e.g., ±3 dBc) is achieved.

Alternative methods for determining transmit power adjustments are also considered. For example, as shown in FIG. 4, in some embodiments the software may also receive an EVM vs. TPC backoff table characterization, which may indicate TPC backoff values (e.g., in dBm) corresponding to EVM values (e.g., in dBc). Like the EVM target value, the EVM vs. TPC backoff characterization may depend on the type of device; for example, different types of devices (e.g., using different components and architectures, and/or implementing different wireless technologies) may have different EVM responses to gain adjustments.

In some embodiments, such an EVM vs. TPC backoff table may be populated based on measurements performed by the wireless device itself. For example, embodiments are considered in which amplifier system 300 periodically (e.g., at system start-up) determines a model of transmit path effects at various gain levels on EVM. The model may be based on EVM measurements at a variety of gain levels of the power amplifier. As one example, a volterra series based model of the transmit path effects (e.g., power amplifier effects) on the EVM of actual transmit signals may be determined. Alternatives may include a polynomial series based model or other mathematical series based model of transmit path effects on the EVM of actual transmit signals, a piecewise-linear model (e.g., storing EVM level information for a variety of gain levels and assuming a linear relationship between EVM and gain between the measured points), or any of a variety of other models.

Figure 8:
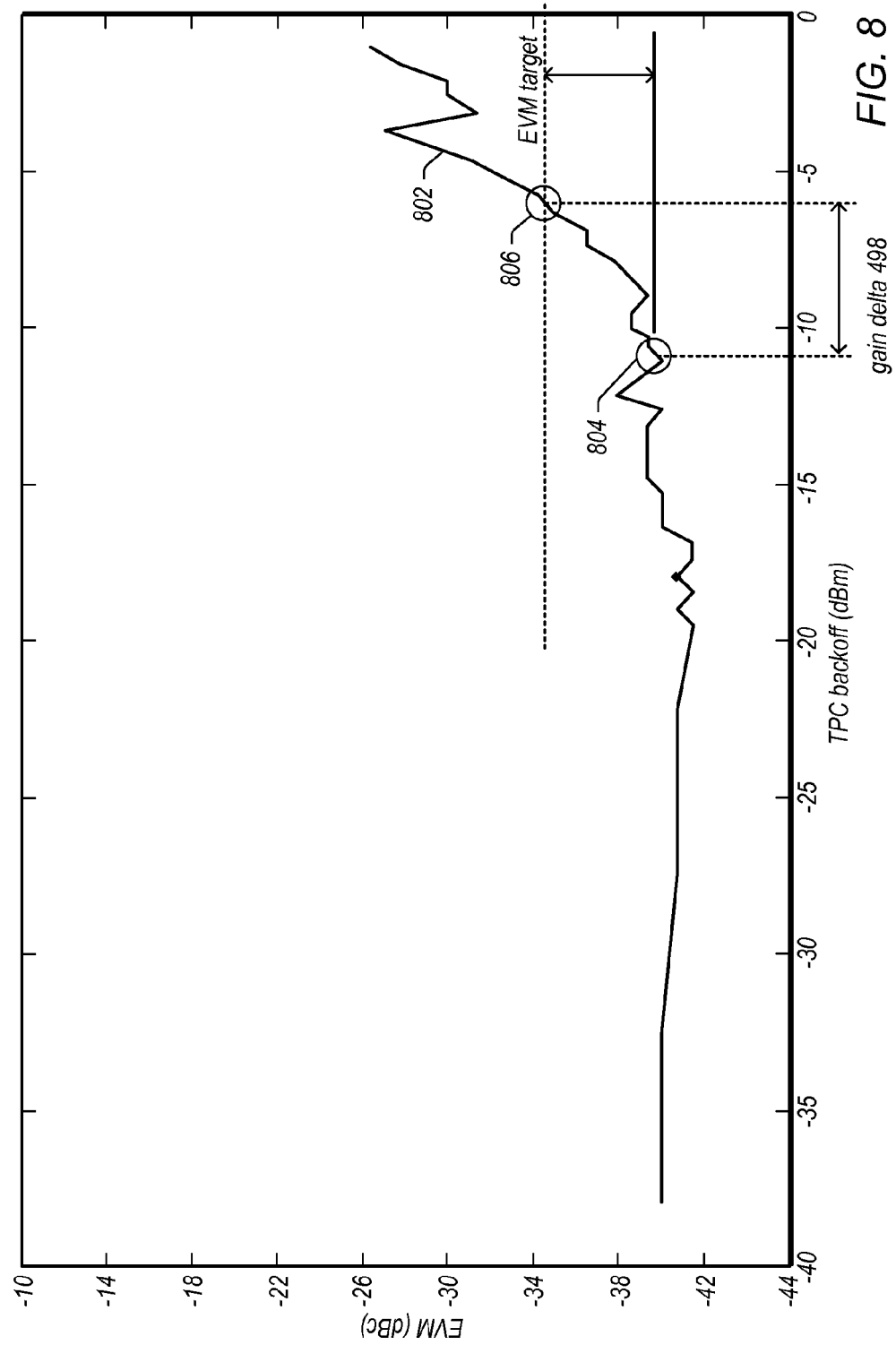
FIG. 8 is a graph illustrating part of a method for determining a gain delta as part of a transmit power control method in accordance with one or more embodiments.

Thus in some embodiments, the gain adjustment may be determined based on the determined EVM of the transmit signal, the EVM target value, and the EVM vs. TPC backoff table characterization. For example, FIG. 8 is a graph illustrating how a gain adjustment may be determined in one embodiment. In the illustrated embodiment, curve 802 is representative of an EVM vs. TPC backoff table characterization, in which each of the points on the curve represents an entry in the table. If the measured EVM level is at point 804 on the curve, and the EVM target value is that shown as point 806, the TPC software algorithm may use the TPC backoff table to determine an appropriate gain delta 498. For example, the gain delta 498 may be a difference (e.g., in dB) between the TPC backoff values corresponding to the determined EVM level and the EVM target level. Thus, after adjusting the gain by the gain delta 498, the EVM level of the transmit signal may hit the EVM target value. The gain delta 498 may be passed to TPC block 446 in hardware 402, which may perform a gain adjustment (e.g., on RF PA 302) to the effect of the gain delta 498.

In some embodiments, training may continue with subsequent (e.g., fine tuning) EVM measurements and corresponding gain setting adjustments, and/or may perform additional EVM measurements in order to confirm that the actual transmit signal (after any determined gain adjustments) meets the target EVM level.

Alternatively, or in addition, any of a variety of other algorithms for determining appropriate gain adjustment values and adjusting TPC based on EVM and/or spectral density measurements may be used as desired.

It should be noted that in some embodiments, predistorter 302 may also be configured to utilize training portion 418 of amplifier system 300; for example, training portion 418 may be used to compare ideal transmit signals with actual transmit signals in order to determine predistorter 302 settings. In some embodiments, e.g., in which pre-distorter logic is already used, an EVM based TPC algorithm may advantageously be able to utilize some parts of the pre-distorter logic in order to minimize additional hardware required to implement the algorithm. For example, in the illustrated embodiment of FIG. 4, only the blocks outlined in dashes may be specific to the EVM based TPC algorithm; all other blocks used for EVM based TPC may also be used for pre-distorter training, resulting in significant hardware use efficiency. In other words, in systems in which an already designed pre-distorter block exists, leveraging this block to also perform the EVM measurements and/or spectral density estimations as part of a transmit power control algorithm such as described herein may require minimal additional hardware or system design modifications.

It will of course be recognized that it is also possible to use a dedicated EVM based TPC hardware section, and/or to share more or less hardware with other functions, and/or different hardware, and that the above described hardware sharing embodiment should be considered a non-limiting exemplary implementation.

Figure 9:
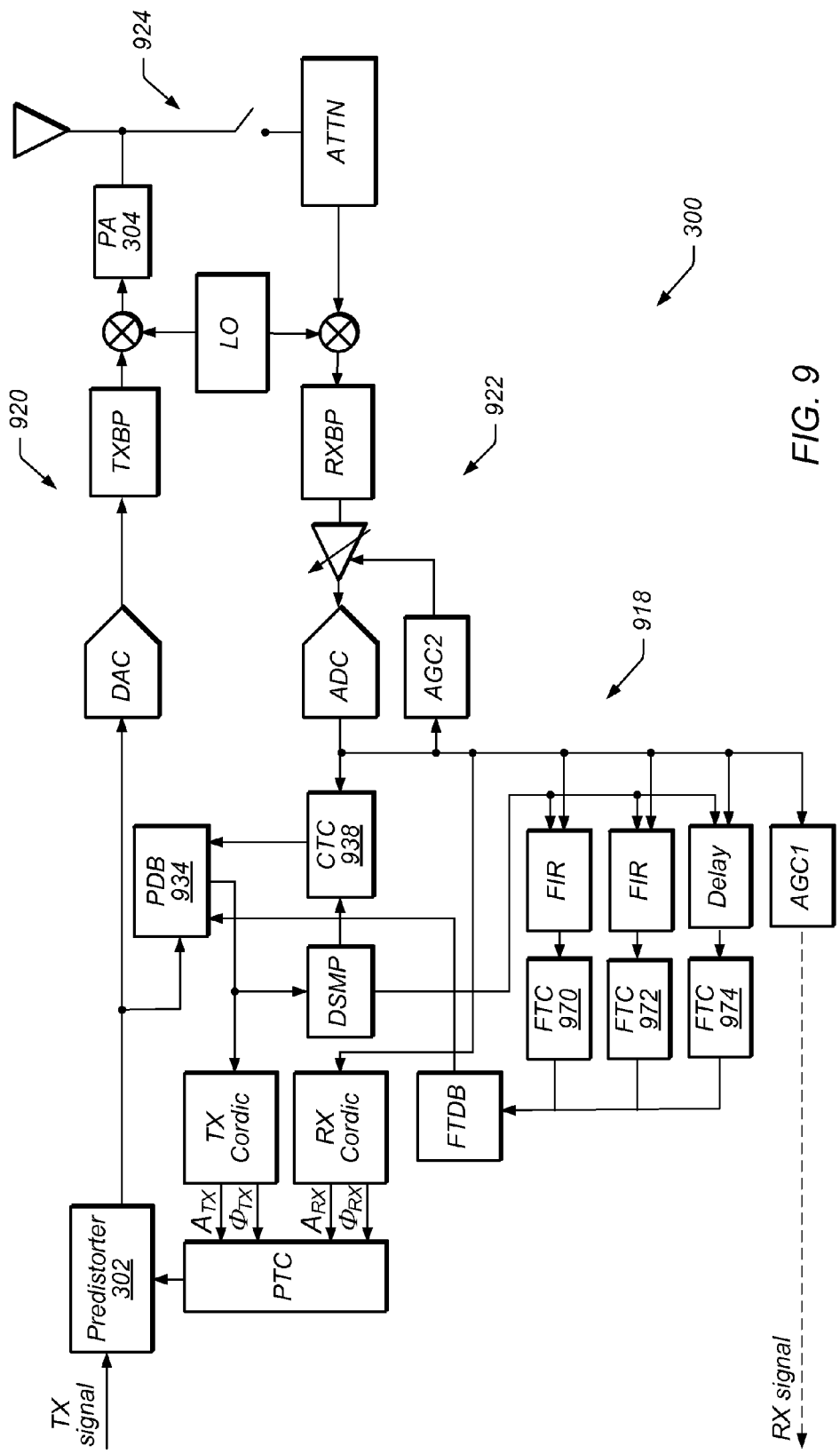
FIG. 9 is a block diagram of an alternate embodiment of the amplifier system including the predistorter in accordance with one or more embodiments.

FIG. 9 is a partial logic diagram of an alternate embodiment of a training portion 918 of amplifier system 300 in accordance with one or more embodiments of the present technique. Similar to FIG. 4, training portion 918 includes a transmitter path 920 that is looped back to receiver path 922 via a loop-back path 924. Training portion 918 may also include predistorter 302, and may be used for predistorter calibration as well as performing EVM measurements. The training portion 918 of FIG. 9, however, differs in architecture from the training portion 418 of FIG. 4. For example, as shown, the training portion 418 of FIG. 4 may utilize an equalizer 430 for aligning the transmit and receive signals in amplitude and phase, while the training portion 918 of FIG. 9 may utilize a programmable delay buffer 934 in combination with coarse and fine timing correlation blocks 938, 970, 972, 974 to achieve the same goal. Other architectural differences will also be apparent to those skilled in the art. Embodiments of the present disclosure may be used in conjunction with either of the system architectures of FIGS. 4 and 9, among other possible system architectures. Further description of the pre-distortion training system of FIG. 9 and pre-distortion training methods in general can be found in U.S. provisional application Ser. No. 61/359,747, titled "Transmit Power Control Utilizing Loopback Error Vector Magnitude Thresholds", and U.S. patent application Ser. No. 12/580,709, entitled "Power Amplifier Linearization Using Digital Predistortion", both of which are incorporated by reference above.

In the illustrated embodiments, a loopback path (e.g., loopback path 424 of FIG. 4 or loopback path 924 of FIG. 9) is utilized to effectively linearize the power amplifier 304. It should be noted that loopback paths could similarly be used to linearize other parts of the transmit (or receive) chain. For example, a loopback from the DAC output to the ADC input may be useful to determine and correct for distortion in the ADC. Other loopback-based linearization of transmit and/or receive path components may also be possible.

Figure 10:
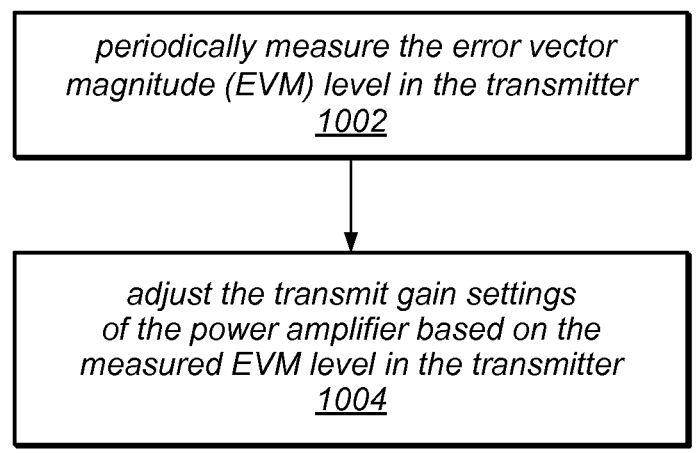
FIG. 10 is a flowchart diagram illustrating a transmit power control method according to one embodiment.

FIG. 10 is a flowchart diagram illustrating operation of one embodiment of a power control algorithm. The method is described below with respect to gain adjustment(s) for a power amplifier in a wireless device, but it should be understood that the gain adjustment(s) may be made for any of a variety of possible gain stages. For example, EVM based transmit power control gain adjustments may be made by adjusting settings of a digital multiplier (e.g., before a DAC), or an active mixer, by reducing attenuation, and/or by adjusting any gain stage in the transmit path of the wireless device.

In 1002 the method periodically measures the error vector magnitude (EVM) level in the transmitter. Measurement of the EVM may include determining differences between an ideal transmit waveform (e.g., without amplification or with effectively linear/non-distorting amplification) and the actual transmit waveform (which has passed through the transmit path and has been amplified). It should be noted that in some embodiments, the "ideal transmit waveform" may be amplified (or possibly attenuated, or amplified by a fractional factor), but at a relatively low gain setting such that substantially no distortion (e.g., non-linearity) is introduced. For example, in some embodiments, total harmonic distortion (THD) of less than −50 dB relative to the input signal may be considered insignificant. In some embodiments, a distortion limit or threshold may be used to ensure that distortion of the ideal transmit waveform is not substantial; for example, a threshold of −60 dBFS may be used in some embodiments. Other values (e.g., higher or lower values) may be used as desired, as long as the level of distortion in the ideal transmit waveform is sufficiently low as to have no significant effect on overall EVM measurements. In other words, the EVM may essentially measure the distortion introduced by the amplifier. The measurement of the EVM level in the transmitter is discussed further below with reference to FIG. 11.

In 1004 the method adjusts the transmit gain settings of the power amplifier based on the measured EVM level in the transmitter. In one embodiment, as the EVM increases, indicating that more distortion is being introduced by the power amplifier, the method may reduce the gain settings of the amplifier to reduce this distortion. If the EVM decreases, the method may increase the gain of the amplifier.

Various algorithms may be used to determine the appropriate adjustment in the amplifier gain settings based on given changes in the EVM. Typically one or more other factors may also be considered in determining the appropriate adjustment in the amplifier gain settings. For example, some characterization of transmit path effects on EVM levels (e.g., typically, the effect of the power amplifier on EVM levels) may be helpful in predicting how much EVM levels may change based on various possible gain setting adjustments of the power amplifier. Such a characterization may be determined, e.g., based on EVM measurements at various gain levels of the power amplifier, and stored, e.g., as a table, or in another form. The characterization may be based on any of a number of models of transmit path effects (e.g., of behavior of the power amplifier). In one set of embodiments, a volterra series based model of may be determined. Alternatively, a polynomial series based model or other mathematical series based model may be determined.

In other embodiments, a piecewise linear model may be determined; for example, information may be stored regarding the determined EVM levels at a plurality of gain levels of the power amplifier, and the information may be used to construct a piecewise linear model of the relationship between EVM and power amplifier gain. In some embodiments, an estimate for the transfer function (TF) of the power amplifier (PA) may be obtained in the training phase. This transfer function may relate the PA input amplitude to PA output amplitude, and PA input phase to PA output phase. An intermediate result of the predistortion circuitry may be a histogram of amplitudes of a training signal. For example, in some embodiments a histogram (or probability distribution function (PDF)) of the likelihood of transmitting at each amplitude, multiplied by the error (e.g., EVM) seen at that amplitude may be produced. These error levels for each amplitude may in some embodiments be summed to estimate a total error. Given these estimates, the expected value of any function of the PA TF may be calculated. One of these functions is the expected squared error, which is related to the EVM. Another useful statistical quantity is the variance of an EVM estimate, which can serve as a reliability measure.

Thus in some embodiments, adjusting the transmit gain settings of the power amplifier may also be based on a characterization of transmit path effects on EVM at various gain levels of the power amplifier, such as a volterra series based model, a polynomial series based model or other mathematical series based model, a piecewise linear model, a transfer function of the power amplifier, or any of a variety of other possible characterizations of transmit path effects on EVM.

In addition, in some embodiments, adjusting the power amplifier gain settings may be based on power spectrum density measurements of the actual transmit signal. For example, for Wi-Fi, while the highest rates are typically EVM-limited, the lower-rates are spectrally limited. In other words, in situations in which EVM is relatively high, gain levels may be more limited by spectral mask requirements than by EVM requirements. Thus, in such embodiments, power spectrum density may be measured, and it may be determined whether the power spectrum density complies with the spectral mask of the transmit signal (e.g., of the protocol or standard of the transmit signal). If the power spectrum density does not comply with the spectral mask, the adjustment to the power amplifier gain settings may be based on the power spectrum density, and may be determined in such a way that the resulting transmit signal does comply with the spectral mask.

The power spectrum density may be measured in a variety of ways. In one exemplary embodiment, a correlator may be used to measure signal energy of the actual transmit signal at various frequencies. For example, embodiments are envisioned in which one or more digital rotators may be used to rotate the frequency of the actual transmit signal to each of a plurality of frequency offsets in order to measure signal energy at each of those frequency offsets. The power spectrum density (e.g., a power spectrum density estimation) may then be determined based on the measured signal energies at those frequency offsets. It should be noted that, as in EVM measurements, it may be appropriate to add in the effects of expected phase noise when determining whether the measured power spectrum density complies with spectral mask requirements. Other ways of measuring the power spectrum density are also considered.

Thus, rather than using a measurement of the absolute power level to control the transmit power, embodiments of the disclosure measure an error vector magnitude (EVM) level in the transmitter and use this measured EVM level to control the transmit power. In this way, the method avoids attempting to "hit" a given transmit power level. Instead, the transmitter may typically aim to transmit at the highest allowable transmit power for a given PHY rate. In embodiments of the invention, the method may periodically measure the EVM at a given transmit power level, and use this information to guide the transmit gain settings. In some embodiments, power spectrum density measurements may also be performed, and may also be used to guide the transmit gain settings. Mask-limited rates may still have an EVM limit, which corresponds to the EVM limit at which the spectral mask begins to become violated.

In various embodiments of the invention, the EVM may be estimated in one of a plurality of different ways. In at least some embodiments, the EVM is measured via a loopback in the analog section of the chip.

Figure 11:
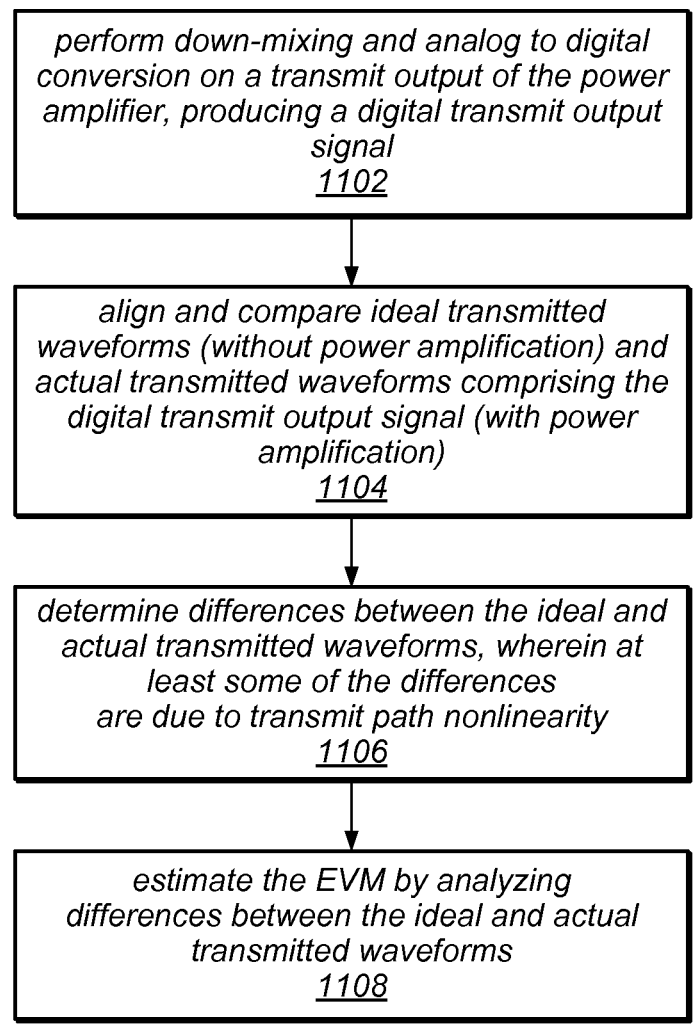
FIG. 11 is a flowchart diagram illustrating further aspects of a transmit power control method according to one embodiment.

FIG. 11 is a flowchart of an exemplary method of measuring the EVM.

As shown, in 1102 the output of the power amplifier (PA) 304 may be down-mixed and converted to a digital signal. Thus, in one preferred implementation, the output of the power amplifier (PA) 304 may be capacitively coupled to the input of the downmixer, which passes the signal through baseband amplifiers and filters to an ADC.

In 1104-1108 the method compares the original (ideal) transmit (or "transmit") waveform with the actual transmit (or "receive") waveform to estimate the EVM. Here the "receive" waveform refers to the transmit waveform after it has passed through the transmit logic including the power amplifier. Thus the EVM essentially measures the error introduced by the power amplifier. Thus, once digitized, the same logic used for PA Pre-distortion (PAPRD) computation aligns and compares the ideal transmitted and actual transmitted waveforms in 1104, determining differences between them (e.g., as a difference vector) in 1106. These differences will typically be due to the transmit path nonlinearity. The receive path is typically set to a very linear level relative to the input, making the majority of the nonlinearity due to the transmit path. Phase noise cancels in the loopback path, and both I/Q mismatch and DC offset have been calibrated out by this point, leaving nonlinearity as the main cause of EVM failure. When estimating the actual EVM, effects like phase noise may be added back in. For example, if the integrated phase noise is typically −32 dBm for a given channel, a noise of this size may be added in the power domain to the PA distortion based EVM estimate to create a final, more accurate EVM estimate.

By analyzing the differences between the ideal digitally transmitted waveform (nearly ideal) and the actual transmitted waveform, the EVM may be estimated, as shown in 1108. This estimation may occur in the time or frequency domain. In a currently preferred implementation the time domain is used, since frequency domain analysis would require more hardware (the FFT is already in use by the transmitter) as well as more synchronization to align the FFT with the symbol boundary. In a different embodiment, frequency domain analysis is used.

In one embodiment, to perform the estimation in the time domain, the difference between the transmitted training signal and the received looped-back signal may be analyzed, e.g., by the PA predistortion circuitry. For example, in one set of embodiments, the following calculation may be performed:

$$\text{Signal\_power} = \text{mean}(\text{transmit\_waveform}^{\wedge}2)$$

$$\text{Error\_power} = \text{mean}(\text{transmit\_waveform} - \text{receive\_waveform})^{\wedge}2)$$

$$\text{EVM} = \text{error\_power}/\text{signal\_power}$$

Other methods of performing EVM estimation are also possible, some of which are further described in the EVM overview section below.

Embodiments of the invention may create a higher average transmit power, while guaranteeing EVM compliance. Since chip variation is not large, especially related to Psat and maximum compliant power, this scheme may result in a transmit power variation across parts that is comparable to current schemes.

If a power level below maximum is desired, this can still be achieved using embodiments of the invention. The power level can still be measured with the maximum compliant EVM, and then the transmit gain can be reduced by a desired amount. Since the maximum EVM-compliant output power is expected to be relatively consistent, and the gain steps themselves are consistent part to part, this scheme can still make accurate output powers at lower levels.

This will create higher average output powers because of the way calibration is done. For existing schemes, the following is typically performed, shown by example:

Parts across skew/temperature/frequency show compliant power between 18 and 20 dBm TPC error/uncertainty is shown to be +/−2 dB To guarantee compliant power, the tx power target is set to 16 dBm, so that even with full TPC error the EVM is compliant;

This results in an actual tx power from 14-18 dBm

Instead, if the EVM is actually measured, and if a 1 dB margin for measurement error is used, the device will transmit 17 to 19 dBm, for a tighter range as well as a higher average power.

EVM: Overview

EVM is a metric used to measure the performance of a wireless (e.g., RF) device. A signal that is processed for transmission is typically modulated in some way, e.g. by phase-shift keying (PSK) or quadrature amplitude modulation (QAM). A representation of a received modulated signal can be captured in a constellation diagram.

Figure 12A:
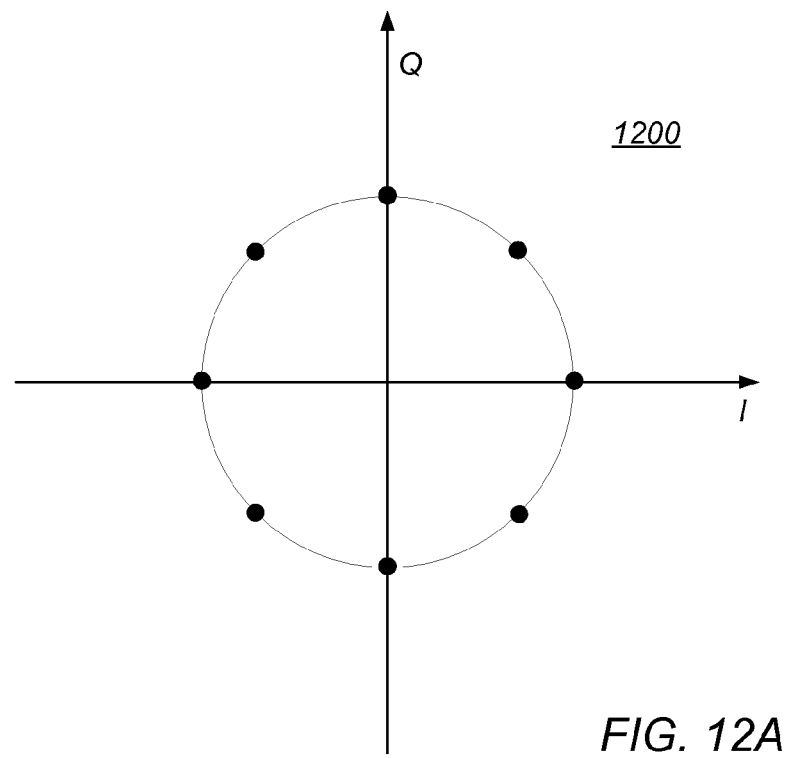
FIG. 12A illustrates a constellation diagram for 8-PSK.
Figure 12B:
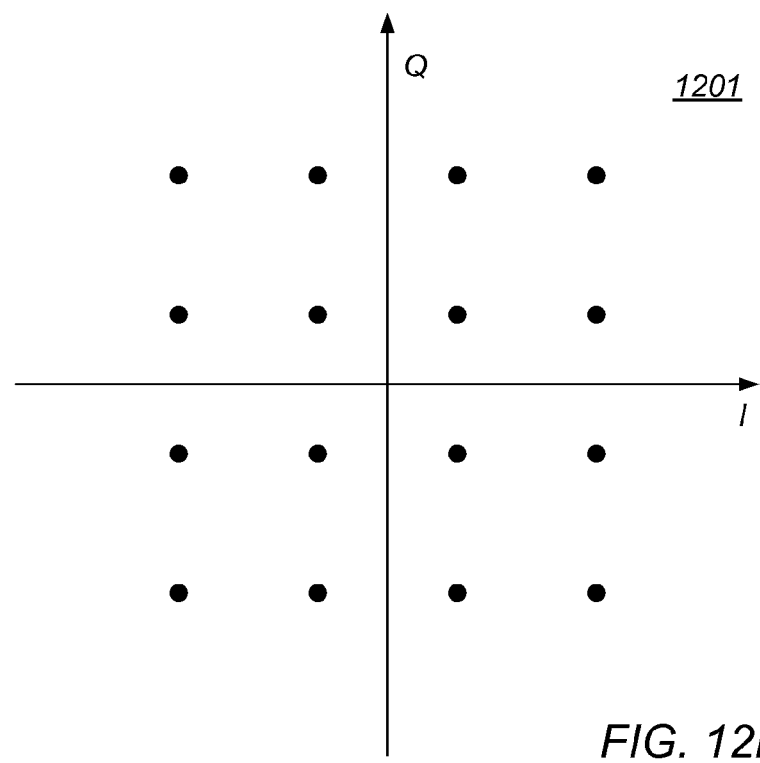
FIG. 12B illustrates a constellation diagram for 16 QAM.

A signal (after channel correction) received by an ideal RF device has all of its constellation points precisely at ideal locations. For example, FIG. 12A illustrates a constellation diagram 1200 for 8-PSK (i.e. 8 constellation points), whereas FIG. 12B illustrates a constellation diagram 1201 for 16 QAM (i.e. 16 constellation points). However, RF device imperfections can cause the actual locations of these constellation points to vary from their ideal locations.

EVM measures how far the constellation points are from their ideal locations. Note that both constellation diagrams 1200 and 1201 have an I-axis (in-phase or real) and a Q-axis (quadrature or imaginary). Therefore, any symbol of a received signal can be characterized as a point on this I-Q plane.

EVM can be estimated in either the time domain or the frequency domain. For example, in the frequency domain, where the symbol after channel correction is x, and the ideal symbol is s, then the EVM is defined by the following equation:

$$EVM = 10\log10\left(\frac{E|s|^2}{E|x-s|^2}\right)$$

where the expectation E is computed for all the symbols in a given frequency bin over the entire packet. Alternatively, Parseval's theorem may be used to show equivalence between the time domain and frequency domain representations of s and x. In this case, EVM may be determined using the following equations:

Signal_power=mean(tx_waveform·^2)

Error_power=mean((tx_waveform−rx_waveform)·^2)

EVM=error_power/signal_power

This may be a rough equivalence, since pilot tones may be accounted for in time-domain EVM but may not be accounted for in frequency-domain EVM. It should be noted, though, that in practice all carriers have roughly the same EVM at the transmitter, and the pilots may not have a significant impact on the overall EVM.

Because pilot symbols are known at the RF device, pilot EVMs can be computed accurately. On the other hand, data symbols are unknown at the RF device and can be estimated for the EVM estimation. To avoid latency, s can be estimated from x by hard slicing (e.g. in PSK, determining the constellation quadrant and then the closest constellation point in that constellation quadrant). It is worth noting that when the detection SNR is low (e.g. when noise is very large compared to the signal), hard slicing may introduce decision errors and lead to smaller error estimates, or greater EVM values. In practice, however, it may be common for EVM limits for many modulations to be set low enough (i.e., strong enough) so that slicing errors will be rare. It should also be noted that hard-slicing is typically not required in time-domain analysis; this may represent an additional advantage to performing EVM determination in the time domain.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method for adjusting transmit power in a wireless communication device, wherein the wireless communication device comprises a transmitter having a power amplifier, the method comprising:
    periodically determining an error vector magnitude (EVM) level in the transmitter of the wireless communication device, wherein the EVM level is determined based at least in part on a difference between an ideal transmit signal without amplification, and an actual transmit signal with amplification;
    adjusting one or more transmit gain settings of a gain stage of the wireless communication device based at least in part on the determined EVM level in the transmitter;
    rotating a frequency of the actual transmit signal to each of a plurality of frequency offsets;
    determining a power spectrum density of the actual transmit signal based at least in part on said rotating;
    determining that the power spectrum density of the actual transmit signal does not comply with a spectral mask of the transmit signal;
    wherein adjusting the one or more transmit gain settings of the gain stage is also based at least in part on the determined power spectrum density of the actual transmit signal and the determination that the power spectrum density of the actual transmit signal does not comply with the spectral mask.

2. The method of claim 1, further comprising:
    determining a mathematical series based model of transmit path effects on the actual transmit signal based at least in part on differences between the ideal transmit signal and the actual transmit signal at a plurality of gain levels;
    wherein adjusting the one or more transmit gain settings of the gain stage is also based at least in part on the determined mathematical series based model.

3. The method of claim 2,
    wherein the mathematical series based model is based at least in part on one of a volterra series model or a polynomial series model.

4. The method of claim 1,
    wherein said determining the EVM level in the transmitter of the wireless communication device comprises:
    receiving the ideal transmit signal, wherein the ideal transmit signal is substantially not distorted by amplification;
    receiving the actual transmit signal, wherein the actual transmit signal comprises a transmit output of the power amplifier;
    performing analog to digital conversion on the actual transmit signal;
    aligning and comparing waveforms comprising the ideal transmit signal and waveforms comprising the actual transmit signal;
    determining differences between the waveforms comprising the ideal transmit signal and the waveforms comprising the actual transmit signal, wherein at least some of the differences are due to transmit path non-linearity;
    estimating the EVM level based at least in part on the determined differences.

5. The method of claim 4,
wherein said estimating the EVM level comprises:
determining a difference vector between the waveforms comprising the ideal transmit signal and the waveforms comprising the actual transmit signal;
calculating the root mean square of the difference vector;
calculating the root mean square of the ideal transmit waveforms;
dividing the root mean square of the difference vector by the root mean square of the ideal transmit waveforms;
wherein the result of said dividing comprises the estimated EVM level.

6. The method of claim 4,
wherein said aligning and comparing is performed by power amplifier pre-distortion logic.

7. The method of claim 4,
wherein said estimating the EVM level comprises adding effects of phase noise to the estimated EVM level.

8. A transmitter configured for use in a wireless communication device, comprising:
transmit logic, wherein the transmit logic is configured to transmit a signal;
wherein the transmit logic comprises at least one gain stage;
wherein the transmit logic is configured to:
periodically determine an error vector magnitude (EVM) level, wherein the EVM level is determined based at least in part on a difference between an ideal transmit signal without amplification, and an actual transmit signal with amplification;
adjust one or more transmit gain settings of the at least one gain stage based at least in part on the determined EVM level in the transmitter
rotate a frequency of the actual transmit signal to each of a plurality of frequency offsets;
determine a power spectrum density of the actual transmit signal based on said rotating; and
determine that the power spectrum density of the actual transmit signal does not comply with a spectral mask of the transmit signal, wherein the transmit logic is configured to adjust the one or more transmit gain settings of the at least one gain stage also based at least in part on the determined power spectrum density of the actual transmit signal and the determination that the power spectrum density of the actual transmit signal does not comply with the spectral mask.

9. The transmitter of claim 8, wherein the transmit logic is further configured to:
determine a mathematical series based model of transmit path effects on the actual transmit signal based at least in part on the differences between the ideal transmit signal and the actual transmit signal at a plurality of gain levels of the wireless communication device;
wherein the transmit logic is configured to adjust the one or more transmit gain settings of the at least one gain stage also based at least on the determined mathematical series based model.

10. The transmitter of claim 9,
wherein the mathematical series based model is based at least in part on one of a volterra series model or a polynomial series model.

11. The transmitter of claim 8, wherein the transmit logic, in order to determine the EVM level in the transmitter, is configured to:
receive the ideal transmit signal, wherein the ideal transmit signal is substantially not distorted by amplification;
receive the actual transmit signal, wherein the actual transmit signal comprises a transmit output of a power amplifier;
perform analog to digital conversion on the actual transmit signal;
align and compare waveforms comprising the ideal transmit signal and waveforms comprising the actual transmit signal;
determine differences between the waveforms comprising the ideal transmit signal and the waveforms comprising the actual transmit signal, wherein at least some of the differences are due to transmit path nonlinearity;
estimate the EVM level based at least in part on the determined differences.

12. The transmitter of claim 11, wherein the transmit logic, in order to estimate the EVM level based at least in part on the determined differences, is configured to:
determine a difference vector between the waveforms comprising the ideal transmit signal and the waveforms comprising the actual transmit signal;
calculate the root mean square of the difference vector;
calculate the root mean square of the ideal transmit waveforms;
divide the root mean square of the difference vector by the root mean square of the ideal transmit waveforms;
wherein the result of said dividing comprises the estimated EVM level.

13. The transmitter of claim 11,
wherein the transmit logic comprises power amplifier pre-distortion logic;
wherein the power amplifier pre-distortion logic is configured to align and compare the waveforms comprising the ideal transmit signal and the waveforms comprising the actual transmit signal.

14. The transmitter of claim 11,
wherein the transmit logic is further configured to add effects of phase noise to the estimated EVM level.

15. A method for adjusting transmit power in a wireless communication device, wherein the wireless communication device comprises a transmitter having a power amplifier, the method comprising:
periodically determining an error vector magnitude (EVM) level in the transmitter of the wireless communication device, wherein the EVM level is determined based on a difference between an ideal transmit signal without amplification, and an actual transmit signal with amplification;
adjusting one or more transmit gain settings of a gain stage of the wireless communication device based at least in part on the determined EVM level in the transmitter;
storing determined EVM level information for each of a plurality of amplitude levels, wherein adjusting the one or more transmit gain settings of the gain stage is also based at least in part on the stored determined EVM level information for the plurality of amplitude levels;
determining a probability of transmitting at each of the plurality of amplitude levels;
multiplying the probability of transmitting by the determined EVM level for each of the plurality of amplitude levels to produce an error level for each of the plurality of amplitude levels; and
summing the error levels for each of the plurality of amplitude levels to determine a total error.

16. The method of claim 15, further comprising:
determining a mathematical series based model of transmit path effects on the actual transmit signal based at least in part on the differences between the ideal transmit signal and the actual transmit signal at a plurality of gain levels;
wherein adjusting the one or more transmit gain settings of the gain stage is also based at least in part on the determined mathematical series based model.

17. The method of claim 16,
wherein the mathematical series based model is based at least in part on one of a volterra series model or a polynomial series model.

18. The method of claim 15,
wherein said determining the EVM level in the transmitter of the wireless communication device comprises:
receiving the ideal transmit signal, wherein the ideal transmit signal is substantially not distorted by amplification;
receiving the actual transmit signal, wherein the actual transmit signal comprises a transmit output of the power amplifier;
performing analog to digital conversion on the actual transmit signal;
aligning and comparing waveforms comprising the ideal transmit signal and waveforms comprising the actual transmit signal;
determining differences between the waveforms comprising the ideal transmit signal and the waveforms comprising the actual transmit signal, wherein at least some of the differences are due to transmit path nonlinearity;
estimating the EVM level based at least in part on the determined differences.

19. The method of claim 18,
wherein said estimating the EVM level comprises:
determining a difference vector between the waveforms comprising the ideal transmit signal and the waveforms comprising the actual transmit signal;
calculating the root mean square of the difference vector;
calculating the root mean square of the ideal transmit waveforms;
dividing the root mean square of the difference vector by the root mean square of the ideal transmit waveforms;
wherein the result of said dividing comprises the estimated EVM level.

20. The method of claim 18,
wherein said aligning and comparing is performed by power amplifier pre-distortion logic.

21. The method of claim 18,
wherein said estimating the EVM level comprises adding effects of phase noise to the estimated EVM level.

22. A transmitter configured for use in a wireless communication device, comprising:
transmit logic, wherein the transmit logic is configured to transmit a signal;
wherein the transmit logic comprises at least one gain stage;
wherein the transmit logic is configured to:
periodically determine an error vector magnitude (EVM) level, wherein the EVM level is determined based at least in part on a difference between an ideal transmit signal without amplification, and an actual transmit signal with amplification;
adjust one or more transmit gain settings of the at least one gain stage based at least in part on the determined EVM level in the transmitter; and
wherein the transmit logic, in order to estimate the EVM level based at least in part on the determined differences, is configured to:
store determined EVM level information for each of a plurality of amplitude levels, wherein the transmit logic is configured to adjust the one or more transmit gain settings of the at least one gain stage based also on the stored determined EVM level information for the plurality of amplitude levels;
determine a probability of transmitting at each of the plurality of amplitude levels;
multiply the probability of transmitting by the determined EVM level for each of the plurality of amplitude levels to produce an error level for each of the plurality of amplitude levels; and
sum the error levels for each of the plurality of amplitudes levels to determine a total error.

23. The transmitter of claim 22, wherein the transmit logic is further configured to:
determine a mathematical series based model of transmit path effects on the actual transmit signal based at least in part on the differences between the ideal transmit signal and the actual transmit signal at a plurality of gain levels of the wireless communication device;
wherein the transmit logic is configured to adjust the one or more transmit gain settings of the at least one gain stage also based at least in part on the determined mathematical series based model.

24. The transmitter of claim 23,
wherein the mathematical series based model is based at least in part on one of a volterra series model or a polynomial series model.

25. The transmitter of claim 22, wherein the transmit logic, in order to determine the EVM level in the transmitter, is configured to:
receive the ideal transmit signal, wherein the ideal transmit signal is substantially not distorted by amplification;
receive the actual transmit signal, wherein the actual transmit signal comprises a transmit output of a power amplifier;
perform analog to digital conversion on the actual transmit signal;
align and compare waveforms comprising the ideal transmit signal and waveforms comprising the actual transmit signal;
determine differences between the waveforms comprising the ideal transmit signal and the waveforms comprising the actual transmit signal, wherein at least some of the differences are due to transmit path nonlinearity;
estimate the EVM level based at least in part on the determined differences.

26. The transmitter of claim 25, wherein the transmit logic, in order to estimate the EVM level based at least in part on the determined differences, is configured to:
determine a difference vector between the waveforms comprising the ideal transmit signal and the waveforms comprising the actual transmit signal;
calculate the root mean square of the difference vector;
calculate the root mean square of the ideal transmit waveforms;
divide the root mean square of the difference vector by the root mean square of the ideal transmit waveforms;
wherein the result of said dividing comprises the estimated EVM level.

27. The transmitter of claim 25,
wherein the transmit logic comprises power amplifier pre-distortion logic;
wherein the power amplifier pre-distortion logic is configured to align and compare the waveforms comprising the ideal transmit signal and the waveforms comprising the actual transmit signal.

28. The transmitter of claim 25,
wherein the transmit logic is further configured to add effects of phase noise to the estimated EVM level.

* * * * *